United States Patent [19]

Cliff et al.

[11] Patent Number: 5,260,611

[45] Date of Patent: Nov. 9, 1993

[54] PROGRAMMABLE LOGIC ARRAY HAVING LOCAL AND LONG DISTANCE CONDUCTORS

[75] Inventors: Richard G. Cliff, Santa Clara; Bahram Ahanin, Cupertino; Craig S. Lytle, Palo Alto; Francis B. Heile; Bruce B. Pedersen, both of Santa Clara; Kerry Veenstra, San Jose, all of Calif.

[73] Assignee: Altera Corporation, San Jose, Calif.

[21] Appl. No.: 880,942

[22] Filed: May 8, 1992

Related U.S. Application Data

[63] Continuation-in-part of Ser. No. 754,017, Sep. 3, 1991.

[51] Int. Cl.$^5$ ........................................ H03K 19/177
[52] U.S. Cl. .................................................. 307/465
[58] Field of Search ............................ 307/465, 465.1

[56] References Cited

U.S. PATENT DOCUMENTS

| | | | |
|---|---|---|---|
| 3,473,160 | 10/1969 | Wahlstrom | 340/172.5 |
| 4,124,899 | 11/1978 | Birkner et al. | 364/716 |
| 4,642,487 | 2/1987 | Carter | 307/465 |
| 4,689,654 | 8/1987 | Brockmann | 307/465 |
| 4,706,216 | 11/1987 | Carter | 365/94 |
| 4,758,745 | 7/1988 | Elgamal et al. | 307/465 |
| 4,758,985 | 7/1988 | Carter | 365/94 |
| 4,786,904 | 11/1988 | Graham et al. | 340/825.830 |
| 4,847,612 | 7/1989 | Kaplinsky | 340/825.800 |
| 4,855,619 | 8/1989 | Hsieh et al. | 307/443 |
| 4,870,302 | 9/1989 | Freeman | 307/465 |
| 4,873,459 | 10/1989 | El Gamal et al. | 307/465 |
| 4,912,345 | 3/1990 | Steele et al. | 307/465 |
| 5,023,484 | 6/1991 | Pathak et al. | 307/468 |
| 5,122,685 | 6/1992 | Chan et al. | 307/465 |
| 5,144,166 | 9/1992 | Camarota et al. | 307/465 |

FOREIGN PATENT DOCUMENTS 1444084 7/1976 United Kingdom .

OTHER PUBLICATIONS

S. S. Yau et al., "Universal Logic Modules and Their Applications", IEEE Transactions on Computers, vol. C-19, No. 2, Feb. 1970, pp. 141-149.

*The Programmable Gate Array Data Book*, Xilinx, Inc., San Jose, Calif., 1988, pp. 1-1 through 2-123.

R. C. Minnick, "A Survey of Microcellular Research", Journal of the Association for Computing Machinery, vol. 14, No. 2, pp. 203-241, Apr. 1967.

S. E. Wahlstrom, "Programmable Logic Arrays—Cheaper by the Millions", Electronics, Dec. 11, 1967, pp. 90-95.

Richard G. Shoup, Programmable Cellular Logic Arrays Mar. (1970) (Ph.D. dissertation, Carnegie-Mellon University (Pittsburgh)).

(List continued on next page.)

*Primary Examiner*—Edward P. Westin
*Assistant Examiner*—Benjamin D. Driscoll
*Attorney, Agent, or Firm*—Robert R. Jackson

[57] ABSTRACT

A programmable logic array integrated circuit has a number of programmable logic modules which are grouped together in a plurality of logic array blocks ("LABs"). The LABs are arranged on the circuit in a two dimensional array. A conductor network is provided for interconnecting any logic module with any other logic module. In addition, adjacent or nearby logic modules are connectable to one another for such special purposes as providing a carry chain between logic modules and/or for connecting two or more modules together to provide more complex logic functions without having to make use of the general interconnection network. Another network of so-called fast or universal conductors is provided for distributing widely used logic signals such as clock and clear signals throughout the circuit.

11 Claims, 11 Drawing Sheets

OTHER PUBLICATIONS

Carr et al., *MOS/LSI Design and Application*, Texas Instruments Electronics Series, McGraw-Hill and Co., 1972, pp. 229–258.

F. Heutink, "Implications of Busing for Cellular Arrays", Computer Design, pp. 95–100, Nov., 1974.

H. Fleisher et al., "An Introduction to Array Logic", IBM Journal of Research and Development, Mar. 1975, pp. 98–109.

K. Horninger, "A High-Speed ESFI SOS Programmable Logic Array with an MNOS Version", IEEE Journal of Solid State Circuits, vol. SC-10, No. 5, Oct. 1975, pp. 331–336.

B. Kitson et al., "Programmable Logic Chip Rivals Gate Arrays in Flexibility", Electronic Design, Dec. 8, 1983, pp. 95–101.

Advanced Micro Devices, "The World's Most Versatile Logic Tool; AmPAL22V10", May 1984.

Monolithic Memories, "Programmable Array Logic; PAL 20RA10", Jun. 1984.

A. Haines, "Field-Programmable Gate Array with Non-Volatile Configuration", Microprocessors and Microsystems, vol. 13, No. 5, Jun. 1989.

K. A. El-Ayat et al., "A CMOS Electrically Configurable Gate Array", IEEE Journal of Solid State Circuits, vol. 24, No. 3, Jun. 1989.

F. Furtek et al., "Labyrinth: A Homogeneous Computational Medium", Proc. IEEE 1990 Custom Integrated Circuits Conference.

H-C. Hsieh et al., "Third-Generation Architecture Boosts Speed and Density of Field-Programmable Gate Arrays", Proc. IEEE 1990 Custom Integrated Circuits Conference.

M. Ahrens et al., "An FPGA Family Optimized for High Densities and Reduced Routing Delay", Proc. IEEE 1990 Custom Integrated Circuits Conference.

PROGRAMMABLE LOGIC ARRAY HAVING LOCAL AND LONG DISTANCE CONDUCTORS

This is a continuation-in-part of U.S. patent application Ser. No. 754,017, filed Sep. 3, 1991.

BACKGROUND OF THE INVENTION

This invention relates to programmable logic array integrated circuits, and more particularly to programmable logic array integrated circuits having improved and more diverse interconnections between the individual logic modules.

Commonly assigned, co-pending U.S. patent application Ser. No. 754,017, filed Sep. 3, 1991 (which is hereby incorporated by reference herein) shows programmable logic array integrated circuits which are highly modular. In the circuits shown in that application, very similar types of interconnection pathways are used for all types of interconnections between the logic modules. This tends to simplify the design of the circuit. It also tends to simplify the software and/or other techniques used to program the circuit to implement particular logic functions. Thus the circuits shown in the above-mentioned application have several important advantages.

There is always room for further improvement, however, and there are some situations in which the provision of additional or alternative types of interconnections between the logic modules would have benefits sufficient to justify the additional circuit and programming complexity. Such additional interconnection paths may be desirable for making frequently needed kinds of interconnections, for speeding certain kinds of interconnections, for allowing short distance connections to be made without tying up more general purpose and therefore long distance interconnection resources, etc. There is also a continuing demand for logic devices with larger capacity. This produces a need to implement logic functions more efficiently and to make better use of the portion of the device which is devoted to interconnecting individual logic modules.

It is therefore an object of this invention to provide improved programmable logic array integrated circuits.

It is a more particular object of this invention to provide programmable logic array integrated circuits with additional possibilities for interconnections between the logic modules.

SUMMARY OF THE INVENTION

These and other objects of the invention are accomplished in accordance with the principles of this invention by providing programmable logic array integrated circuits which basically employ a highly modular structure of logic elements and logic element interconnection pathways, but which also have one or more of several types of additional interconnection pathways for such purposes as making interconnections locally without tying up resources in the general interconnection structure. For example, such local interconnections may include carry chain interconnections between adjacent or nearby logic modules, or cascade logic connections between such modules in order to allow concatenation of the logic in those modules without recourse to the general interconnection structure. Where, as is preferred, the logic modules are grouped in logic array blocks ("LABS") which are in turn arranged on the integrated circuit in rows and columns, these additional local interconnections may not only be provided between logic modules within an LAB, but also to logic modules in the LABs in another (typically adjacent) row and/or column.

In embodiments employing a network of so-called global horizontal and vertical conductors, interconnections between those conductors are preferably made through tri-state drivers rather than mere passive connections in order to boost signals which may be required to travel relatively long distances through the circuit. Such drivers may alternatively or in addition be used on all logic module output signals which drive relatively long conductors on the circuit.

In addition to the network of global horizontal and vertical conductors typically used for making interconnections between all but relatively closely adjacent logic modules and connections to most of the input and output terminals of the circuit, another auxiliary network of horizontal and vertical conductors (so-called universal fast conductors) may be provided for distributing certain widely used logic signals such as clock and clear signals throughout the circuit. For example, conductors in this universal fast conductor network may be connectable to every logic module in the circuit.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
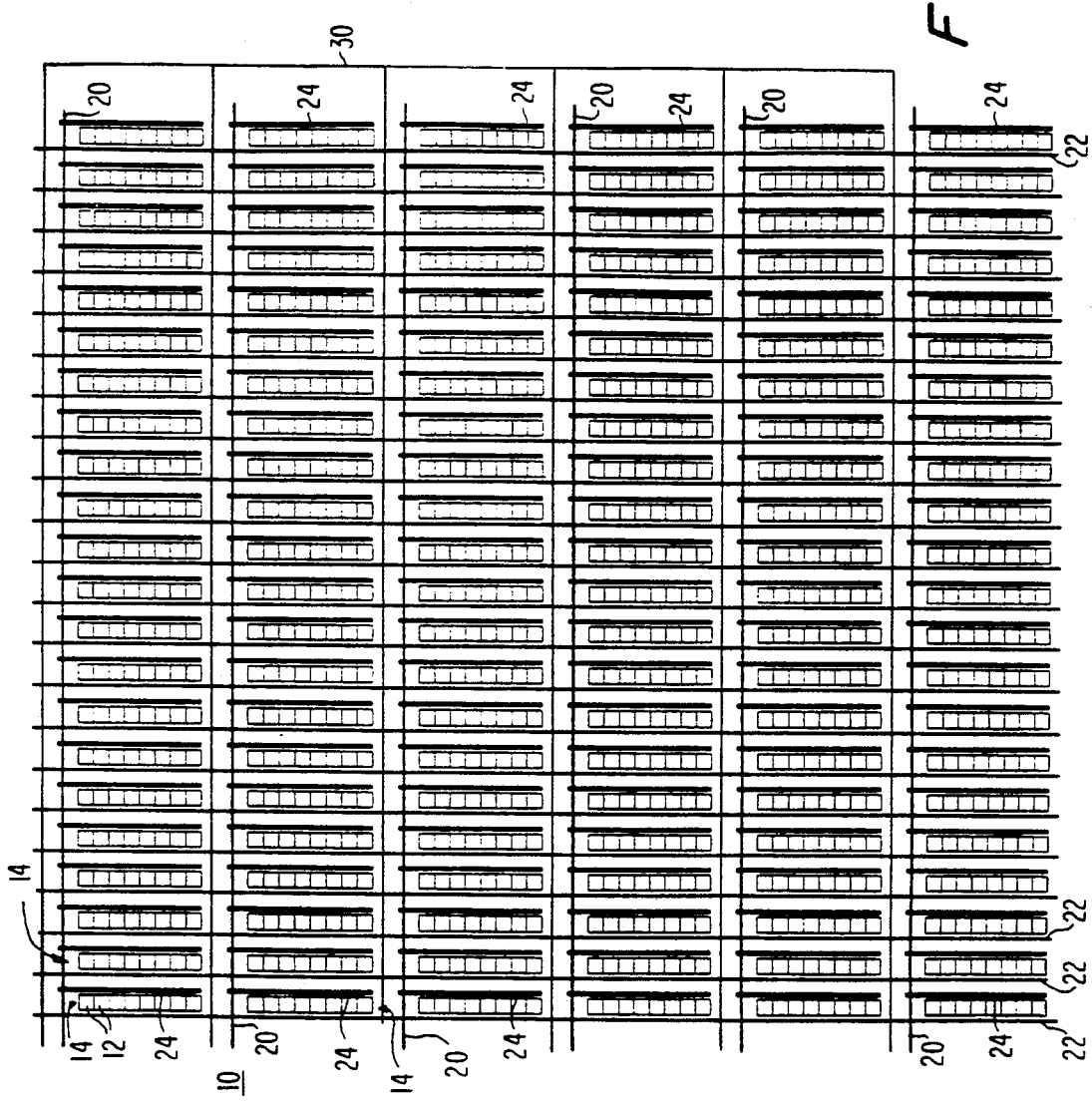
FIG. 1 is a simplified schematic block diagram of an illustrative programmable logic array integrated circuit constructed in accordance with the principles of the invention.

FIG. 1 shows the overall organization of an illustrative programmable logic array integrated circuit 10 constructed in accordance with the principles of this invention. Not all of the conductors employed in circuit 10 are shown in FIG. 1, but enough is shown in this FIG. to begin the discussion. Each logic module 12 is represented by a small square in FIG. 1. Logic modules 12 are grouped together in groups of eight. Each of these groups is referred to as a logic array block or LAB 14. LABs 14 are arranged in six horizontal rows and 22 vertical columns on circuit 10. Accordingly, there are a total of 132 LABs 14 and 1056 logic modules 12 on circuit 10. Each logic module 12 is capable of performing a relatively elementary logic function (discussed in more detail below), but extremely complex logic can be performed by variously interconnecting the logic modules as will now be discussed.

The interconnection circuitry shown in FIG. 1 includes (1) groups of so-called global horizontal conductors 20 interspersed between the horizontal rows of LABs, and (2) groups of global vertical conductors 22 interspersed between the vertical columns of LABs. These conductors are global in the sense that they extend along an entire row or column. Programmable interconnections can be made between intersecting horizontal and vertical conductors in order to apply signals on the vertical conductors to the horizontal conductors. Each LAB 14 has a group of vertical LAB input conductors 24 for conveying signals from the global horizontal conductors 20 intersected by conductors 24 to the logic modules 12 in that LAB.

In addition to the above-described conductors, FIG. 1 shows part of a network of so-called universal fast conductors. The conductors 30 of this network shown in FIG. 1 extend throughout the entire circuit and can be used as will be described in more detail below to convey widely used logic signals such as clock and/or clear signals to any logic modules 12 on the circuit.

Although other numbers of conductors can be used if desired, in the depicted preferred embodiment, there are 176 conductors in each group of global horizontal conductors 20, there are 16 conductors in each group of global vertical conductors 22, there are 24 conductors in each group of LAB input conductors 24, and there are four universal fast conductors 30.

Figure 2:
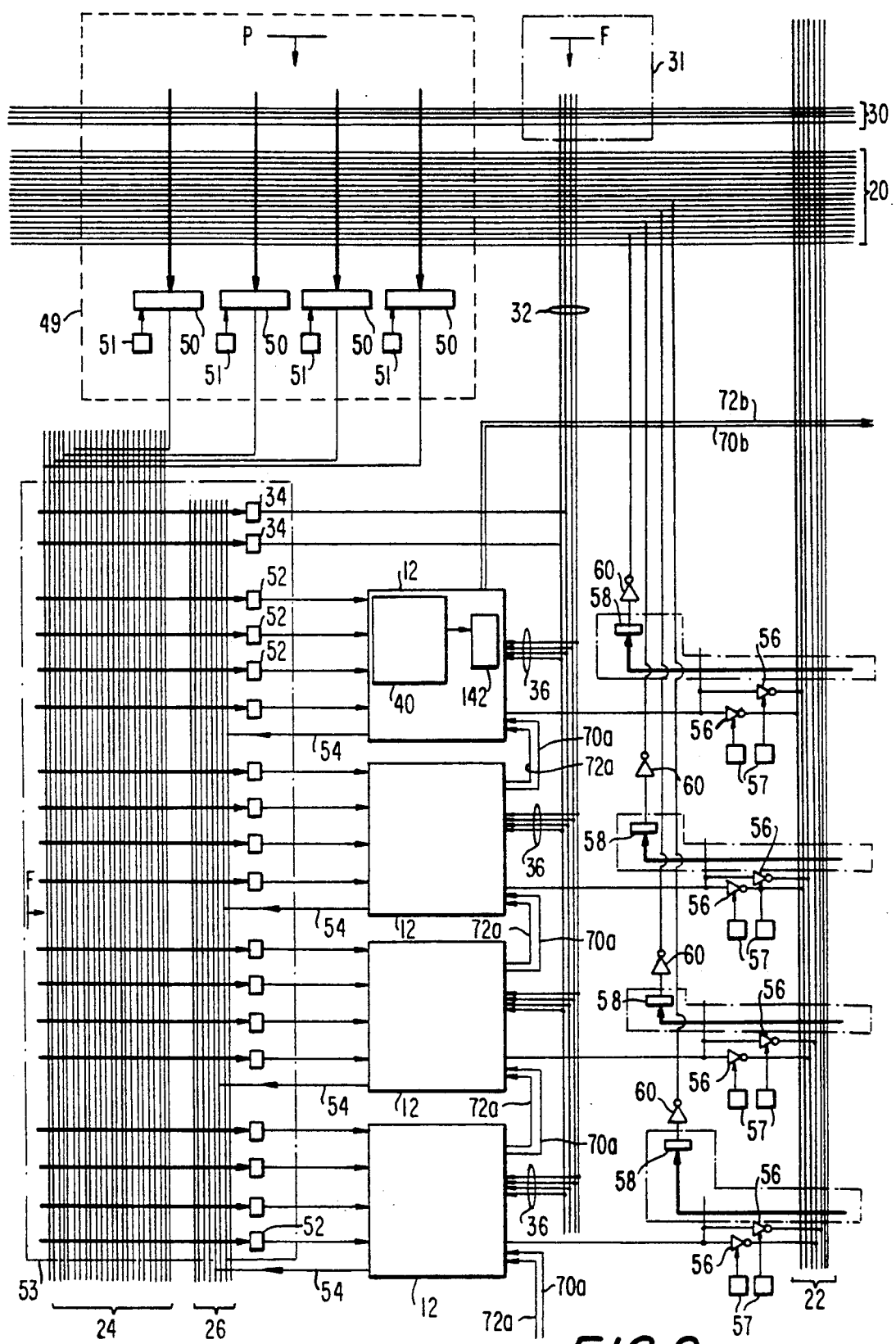
FIG. 2 is a more detailed schematic block diagram of an illustrative embodiment of a representative portion of the circuit shown in FIG. 1.

Turning now to FIG. 2 which shows one possible implementation of part of a typical LAB 14 on circuit 10, four representative logic modules 12 are shown. Although logic modules 12 can be implemented in other ways (e.g., as product-term-based macrocells (an alternative which is discussed in more detail below, for example, in connection with FIGS. 7a-c)) in the illustrative embodiment shown in FIG. 2 each logic module 12 includes a look up table or universal logic block ("ULB") 40 and a flip-flop type device 142. Each look up table 40 is basically a circuit which can be programmed to produce an output signal which is any logical function of four input signals applied to the look up table. Each flip-flop 142 is a circuit which can be programmed either to store or to simply pass through the output signal of the associated look up table (see, for example, the circuit shown in Norman et al. U.S. Pat. No. 4,864,161). Alternatively, device 142 could be a flip-flop with no pass through or bypass capability.

In addition to the above-described representative logic modules, FIG. 2 shows portions of representative global horizontal conductors 20, global vertical conductors 22, LAB input conductors 24, and universal fast conductors 30. Each of LAB input conductors 24 can be connected to a selected one (or more) of conductors 20 and 30 via a programmably controlled programmable logic connector ("PLC") 50 (only some of which are shown in FIG. 2). PLCs 50 can be implemented in any of a wide variety of ways. For example, each PLC 50 can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs 50 are EPROMs, EEPROMs, pass transistors, transmission gates, antifuses, laser fuses, metal optional links, etc. The components of PLCs 50 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable).

In the depicted, presently preferred embodiment each PLC 50 a 15-to-1 switch which is controlled by programmable function control elements ("FCEs") 51 on circuit 10 to connect one of its 15 inputs to its output. Each of the 15 inputs is the signal on a predetermined respective one of conductors 20 or 30. There is one PLC 50 for each of the 24 LAB input conductors 24. Each of conductors 20 and 30 is connected to two of PLCs 50. Accordingly, each of conductors 20 and 30 is connectable to two of conductors 24. The letter P and the associated arrow symbol inside dotted line 49 indicate that the population of connections from conductors 20 and 30 to the inputs of each of PLCs 50 is a partial population.

FCEs 51 can also be implemented in any of several different ways. For example, FCEs 51 can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like.

Each of the four data inputs to each logic module 12 can be connected to any one (or more) of LAB input conductors 24 (and/or any one (or more) of local conductors 26) via a PLC 52. PLCs 52 (and each similar PLC 34 which are discussed below) may have any of the characteristics described above for the general case of PLCs 50. However, in the depicted, presently preferred embodiment each of PLCs 52 (and each similar PLC 34) is a 32-to-1 switch so that any one of the 24 LAB input conductors 24 or any one of the eight local conductors 26 can be connected to each LAB data input. Accordingly, the letter F and the associated arrow symbol inside chain dotted line 53 indicate that the population of connections from conductors 24 and 26 to PLCs 34 and 52 is a full population. To avoid overcrowding the drawing, the FCEs (similar to above-described FCEs 51) for programmably controlling PLCs 34 and 52 are not shown separately, but rather are assumed to be part of elements 34 and 52.

Figure 9:
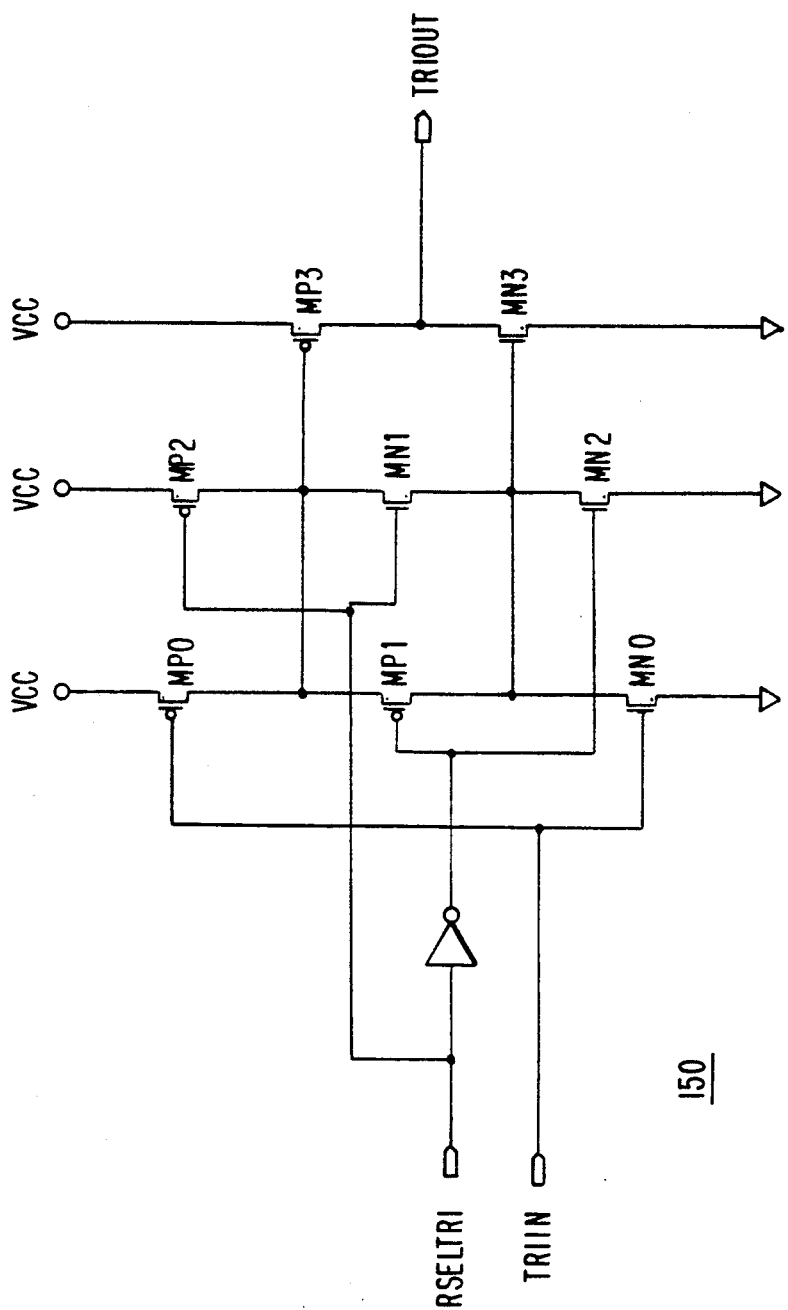
FIG. 9 is a schematic diagram of an illustrative embodiment of a representative element shown in FIG. 2.

The data output of the flip-flop 142 in each logic module 12 can be applied (via conductor 54) to a respective one of local conductors 26. These conductors serve only the logic modules in the associated LAB 14. In other words, conductors 26 do not extend beyond the associated LAB. The data output of the flip-flop 142 in each logic module 12 can also be applied to either or both of two global vertical conductors 22 (via tri-state drivers 56), and to one of global horizontal conductors 20 (via PLC 58 and tri-state driver 60). The other input or inputs to each PLC 58 are the signals from one or more global vertical conductors 22. Accordingly, global vertical conductors 22 are selectively connectable to global horizontal conductors 20 via PLCs 58 and tri-state drivers 60. PLCs 58 may be similar to any of the above-described PLCs. The use of tri-state drivers 56 and 60 is advantageous to strengthen signals which may be required to travel relatively long distances throughout circuit 10 and/or which may be inputs to relatively large numbers of other components. A suitable tri-state driver is shown in FIG. 9 and described in detail below. Some or all of tri-state drivers 56 and 60 may be controlled (i.e., turned on or off) by FCEs (e.g., FCEs 57) on circuit 10. PLCs 58 are also typically controlled by FCES on the circuit. All of these FCEs may be similar to above-described FCEs 51.

In addition to being available as data inputs to logic modules 12, the signals on any of conductors 24 and 26 can also or alternatively be applied to any of local vertical conductors 32 via PLCs 34. In the depicted, presently preferred embodiment, each of PLCs 34 is a 32-to-1 switch, but PLCs 34 can alternatively have any of the characteristics described above for the general case of PLCs 50. Although only two PLCs 34 are shown in FIG. 2, there is preferably one such PLC for each of the four conductors 32. Each of conductors 32 is connectable to any one of universal fast conductors 30 for receiving the signal on the fast conductor. These connections from conductors 30 to conductors 32 are preferably made in the same way that the connections from conductors 24 and 26 to conductors 32 are made, i.e., by PLCs controlled by FCEs (all represented by element 31 in FIG. 2). Again, although each of these PLCs can have any of the characteristics described above for the general case of PLCs 50, in the depicted, presently preferred embodiment each of these PLCs can connect any of conductors 30 to an associated one of conductors 32. The letter F and the arrow symbol inside chain dotted line 31 indicate that the population of possible connections from conductors 30 to each of conductors 32 is a full population. Each of conductors 32 is connectable (via conductors 36) to each of logic modules 12. FCE-controlled PLCs in each logic module allow these signals to be used for such purposes as flip-flop clock and flip-flop clear (see FIG. 8 (discussed below) which shows an illustrative logic module 12 in more detail). Thus local vertical conductors 32 are known as clock and clear lines and can be driven from fast lines 30 for synchronous clocks and clears (i.e., clocks and clears which come from outside of device 10 and are available everywhere throughout device 10), or from LAB input lines 24 or local lines 26.

There are two other types of logic module interconnections shown in FIG. 2 which require discussion. The first of these is carry chain interconnection represented in part by conductors 70a and 70b. These interconnections allow a carry out output of each logic module 12 to be used as a carry in input to an adjacent or nearby logic module as shown, for example, in commonly assigned, co-pending U.S. patent application Ser. No. 07/880,752 (see also FIG. 8 herein). For example, carry chain conductors 70a allow the carry out output of each logic module 12 shown in FIG. 2 to be the carry in input to the next higher logic module in that FIG. Similarly, carry chain conductor 70b runs from the top-most logic module 12 in the LAB fragment shown in FIG. 2 to the bottom-most logic module in the horizontally adjacent LAB in the adjacent column of LABs. This allows the carry chain to continue from LAB to LAB if desired.

The other type of logic module interconnection remaining to be discussed is illustrated by representative conductors 72a and 72b in FIG. 2 (see also commonly assigned, co-pending U.S. patent application Ser. No. 07/880,888. These conductors are called cascade connect conductors. They allow the data outputs of adjacent or nearby logic modules 12 to be logically combined, if desired, to perform more complex logic functions without the need to pass intermediate data through the general interconnection network. The manner in which cascade connect conductors 72 are employed in the logic modules is shown in detail in FIG. 3.

Figure 3:
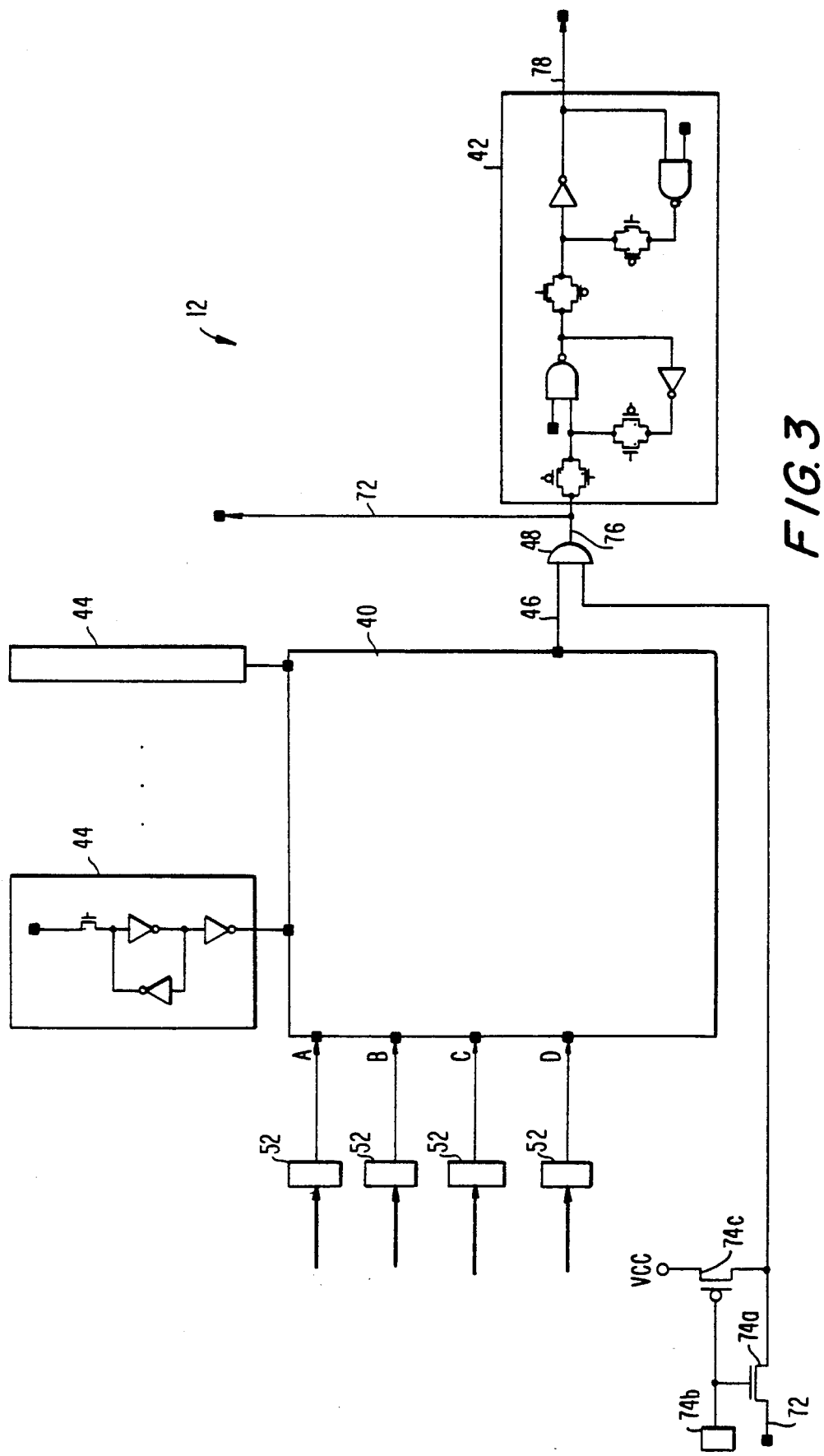
FIG. 3 is a still more detailed schematic block diagram of an illustrative embodiment of a representative portion of the circuitry shown in FIG. 2.

As shown in FIG. 3, a typical logic module 12 includes look up table or ULB 40 which is controlled by 16 FCEs 44 to produce on data output lead 46 any desired logical function of the four data input signals from PLCs 52. (Although in the particular embodiment shown in FIG. 3 a representative FCE 44 is depicted as a RAM cell, it will be understood that FCEs 44 can be implemented in any of a wide variety of ways as discussed above in connection with FCEs 51). The signal on lead 46 is applied to one input of AND gate 48. (Although shown as an AND gate in FIG. 3, cascade connect device 48 could alternatively be any other suitable two-input logic function such as an EXCLUSIVE OR gate.) The other input to AND gate 48 is the cascade connect input from another logic module 12 gated by transistor 74a which is controlled by FCE 74b (similar to previously described FCEs). (If transistor 74a is disabled by FCE 74b, then transistor 74c is enabled to connect the second input of AND gate 48 to a source of logical 1 potential.) Accordingly, assuming that transistor 74a is enabled, AND gate 48 produces an output signal on lead 76 which is the logical AND of the signals on incoming leads 46 and 72. The signal on lead 76 can therefore be a significantly more complex logic function than could be produced by one look up table 40 by itself. In addition to being applied to flip-flop 42 and then by way of lead 78 and elements 54, 56, 58, and 60 to the more general interconnection structure, the signal on lead 76 is also applied to another cascade connect conductor 72 for cascade connection to another adjacent or nearby logic module 12 in the same way that the incoming lead 72 shown in FIG. 3 is connected to the logic module shown in that FIG.

FIG. 2 shows that each cascade connect conductor 72a from a logic module 12 is connected to the next higher logic module in that FIG. The cascade connect output from the top-most logic module 12 in FIG. 2 goes (via cascade connect conductor 72b) to logic modules in an adjacent column of LABs (e.g., to the bottom-most logic modules in the LAB immediately to the right of the LAB fragment shown in FIG. 2).

Figure 4:
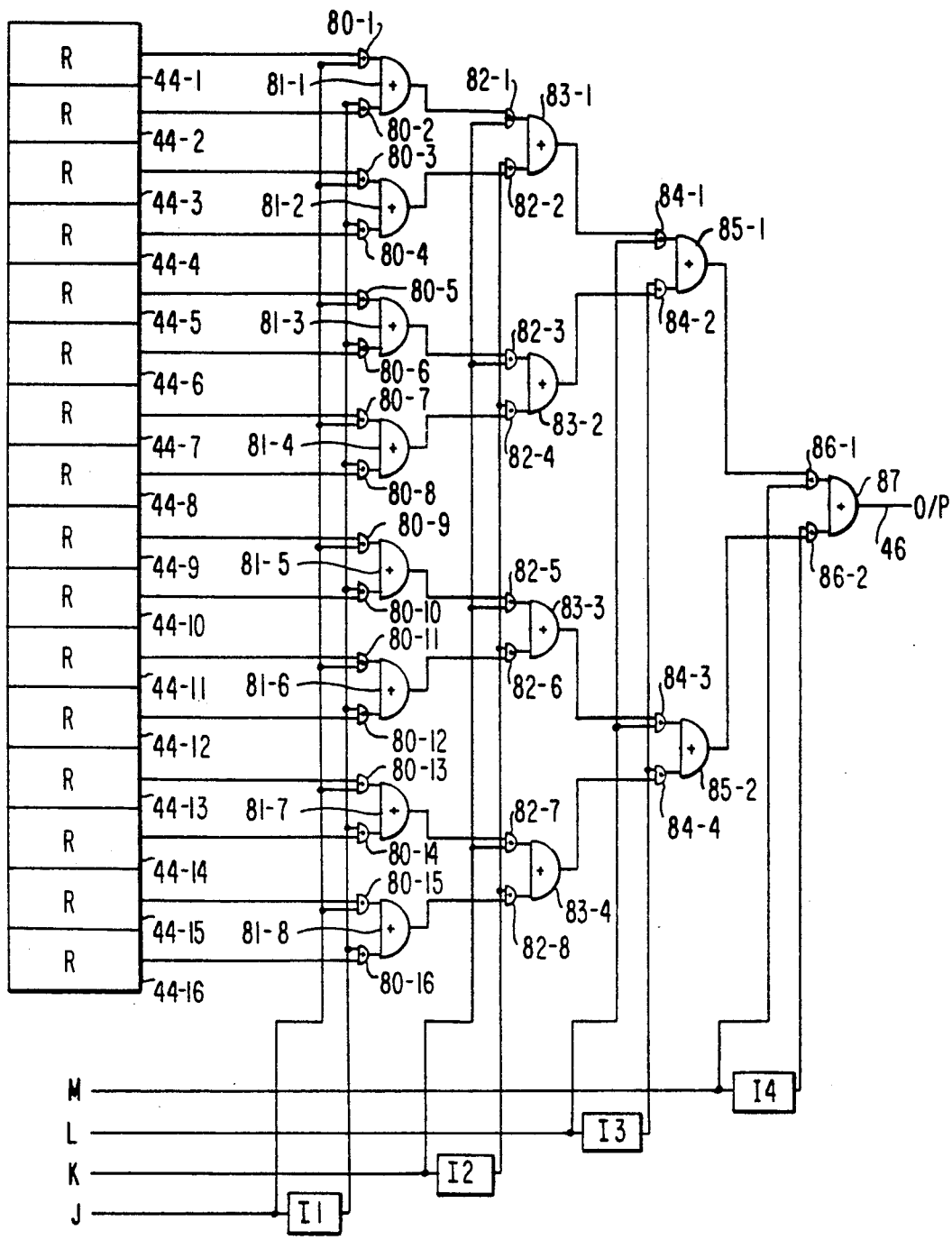
FIG. 4 is a schematic block diagram of an illustrative embodiment of a portion of the circuitry shown in FIG. 3.

FIG. 4 shows a typical basic look up table 40 in more detail. (Look up table 40 may be modified as shown in above-mentioned U.S. patent application Ser. No. 07/880,752 to facilitate performance of fast carry logic, but FIG. 4 shows the basic structure of a four-input look up table.) This table is controlled by 16 FCEs 44. The output signal of each of these FCEs is applied to a respective one of 16 AND gates 80. Alternate ones of AND gates 80 are respectively controlled by the true and complement of the first data input J, the complement of input J being produced by inverter I1. The outputs of adjacent pairs of switches 80 are then combined by OR gates 81 and applied to eight AND gates 82. Alternate ones of AND gates 82 are respectively controlled by the true and complement of the second data input K, the complement of input K being produced by inverter I2. The outputs of adjacent pairs of AND gates 82 are combined by OR gates 83 and then applied to four AND gates 84. Alternate ones of AND gates 84 are respectively controlled by the true and complement of the third data input L, the complement of input L being produced by inverter 13. The outputs of adjacent pairs of AND gates 84 are combined by OR gates 85 and applied to two AND gates 86. One of AND gates 86 is controlled by the true of the fourth data input M, while the other AND gate 86 is controlled by the complement of that input (produced by inverter 14). The outputs of AND gates 86 are combined by OR gate 87 to produce the data output on conductor 46. It will be apparent from the foregoing that any desired logical function of data inputs J-M can be produced by appropriately programming FCEs 44.

Figure 5:
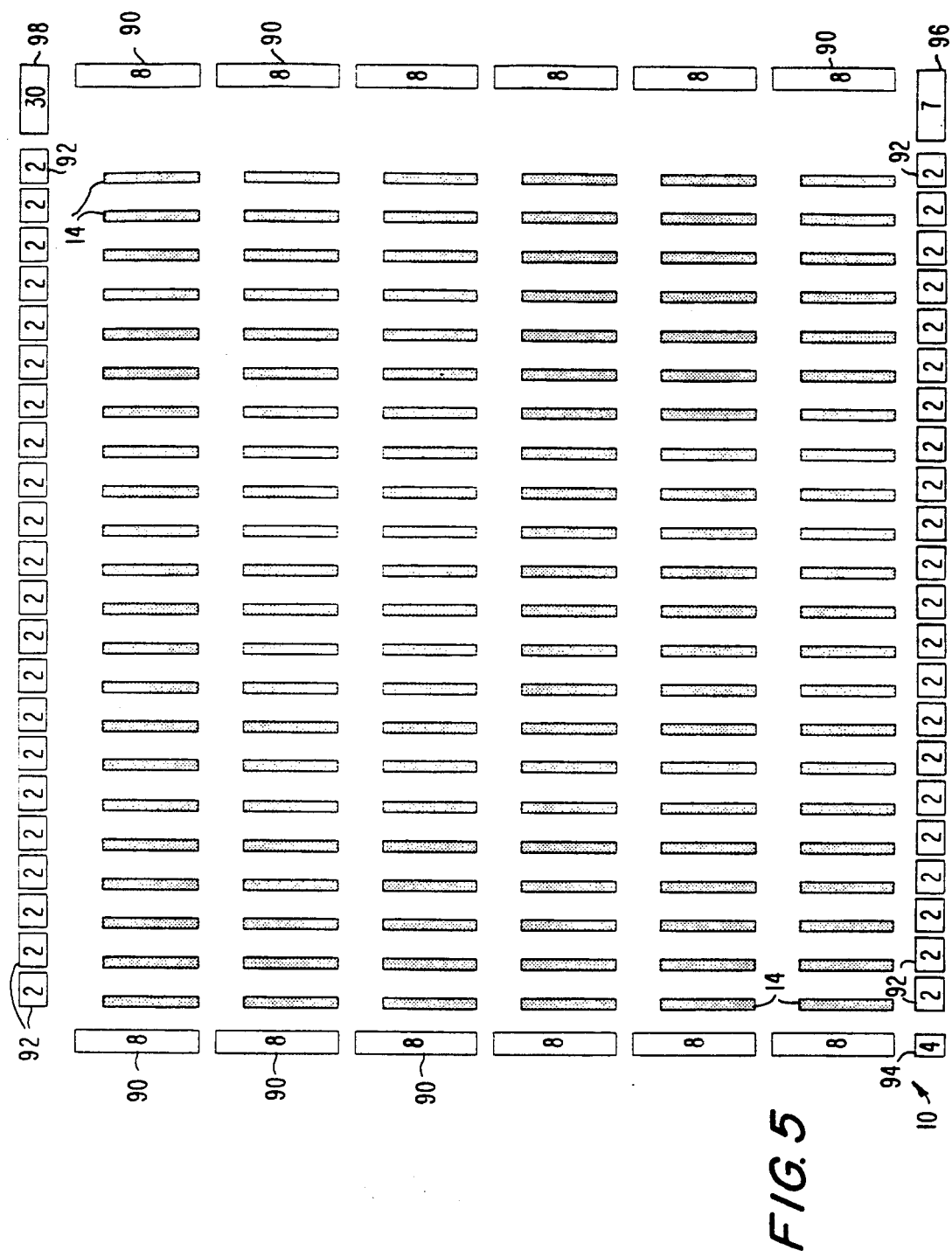
FIG. 5 is another view of the circuit of FIG. 1 showing an illustrative embodiment of additional elements of that circuit.

FIG. 5 shows how input/output pins may be provided on circuit 10. Six groups 90 of eight input/output pins are shown along each side of circuit 10. Twenty-two groups 92 of two input/output pins are shown along each of the top and bottom of the circuit. In addition, there are four fast input pins 94 respectively connected to fast conductors 30, seven control pins 96 for use during programming of device 10, and approximately 30 supply pins 98 for supplying power and ground potential to device 10.

Figure 6A:
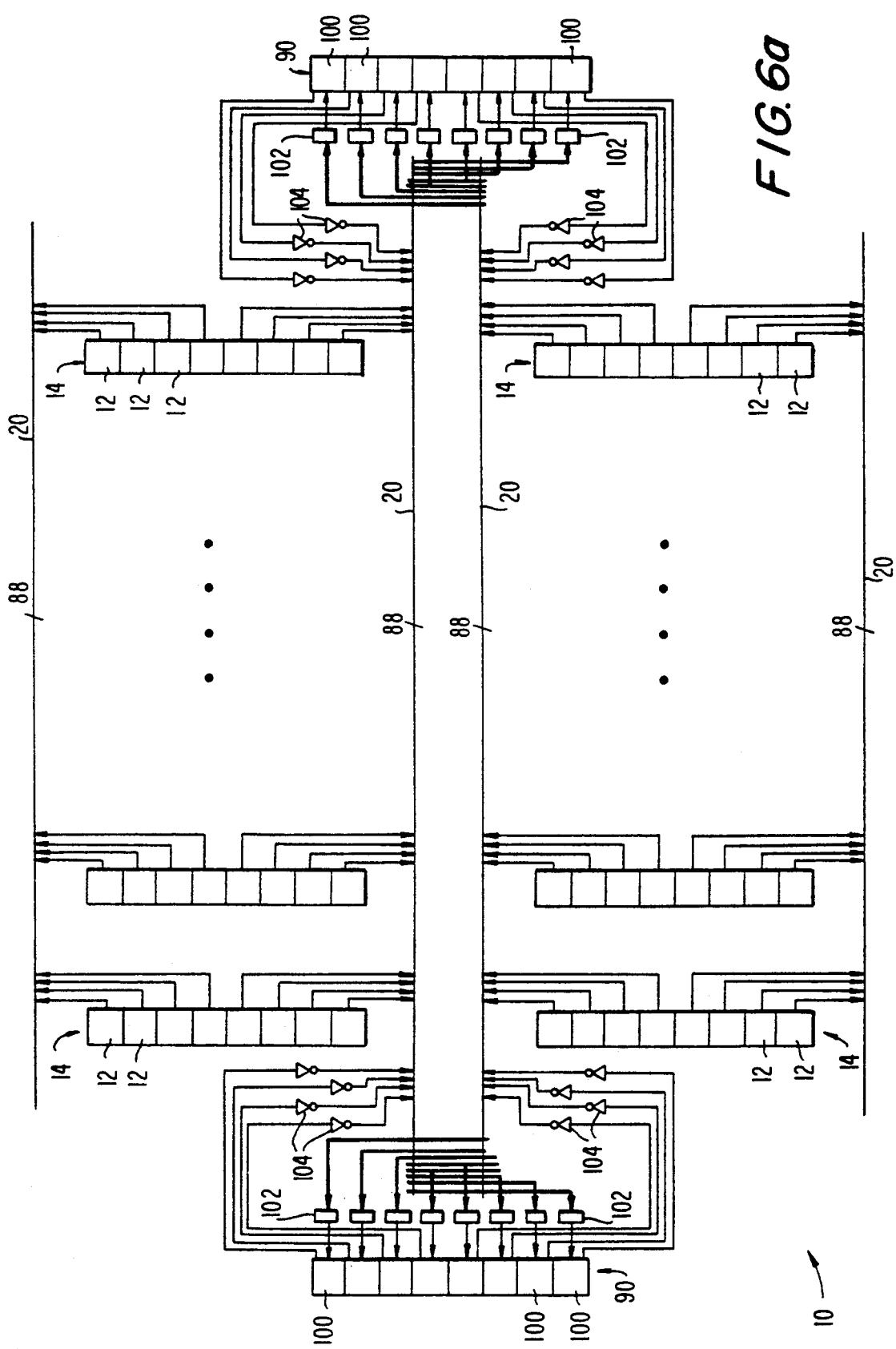
FIGS. 6a and 6b are schematic block diagrams showing an illustrative embodiment of representative portions of FIG. 5 in more detail.
Figure 6B:
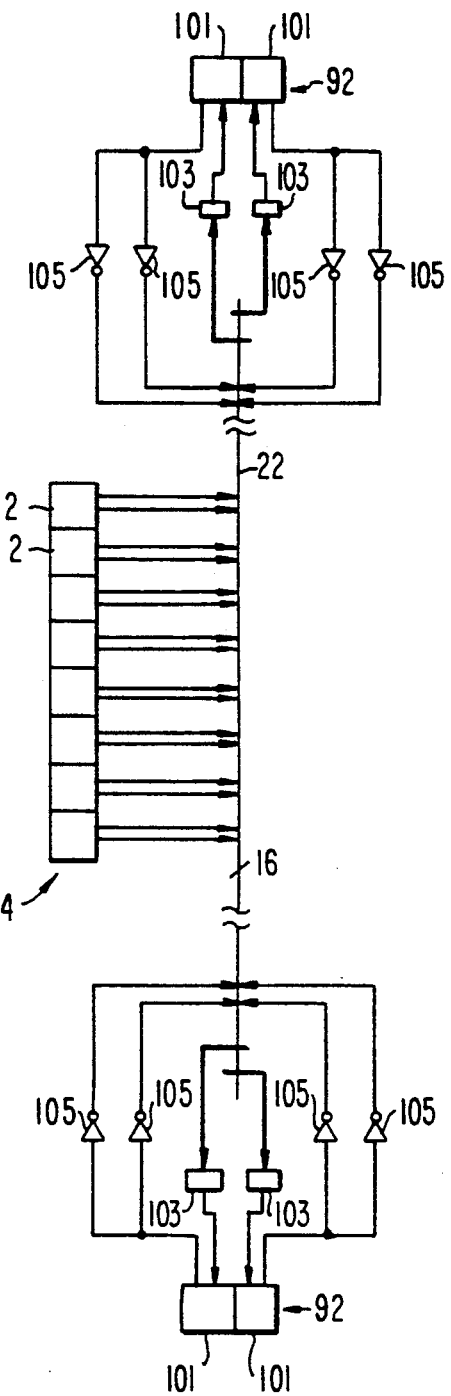

Although other arrangements for connecting the conductors on device 10 to its input/output pins are possible, FIGS. 6a and 6b show parts of an illustrative embodiment of such an arrangement. In FIG. 6a the 176 global horizontal conductors 20 associated with each horizontal row of LABs 14 are arranged so that half can receive the outputs of the drivers 60 (FIG. 2) associated with the top four logic modules 12 in each LAB in that row, while the other half of these conductors 20 can receive the outputs of the drivers 60 associated with the lower four logic modules 12 in each LAB in that row. Accordingly, in FIG. 6a each group of 176 global horizontal conductors 20 is shown divided into two subgroups of 88 such conductors, one subgroup being above the associated row of LABs 14, and the other subgroup being below that row of LABs. Each input/output pin 100 in each group 90 of such pins can receive an output via a PLC 102 from the conductors 20 in two subgroups of 88 such conductors. (Again, PLCs 102 can have any of the characteristics described above for the general case of PLCs 50, and PLCs 102 are controlled by programmable FCEs similar to those described above.) One of these two subgroups of conductors is associated with the lower logic modules 12 in one row of LABs 14, while the other subgroup of conductors is associated with the upper logic modules 12 in the LAB row immediately below the first row.

For use as an input pin, each pin 100 is connected through two tri-state drivers to two of conductors 20. Thus each symbol 104 in FIG. 6a represents two tri-state drivers, each of which is programmably controlled (e.g., by an FCE similar to those described above).

In FIG. 6b the 16 global vertical conductors 22 associated with each vertical row of LABs 14 are split into two groups of eight conductors at the top and bottom of the device. Each group of eight conductors is applied to a respective one of PLCs 103 (similar to the above-described PLCs). Each PLC 103 applies one (or more) of the signals applied to it to an associated input/output pin 101. For use as an input pin, each pin 101 is connected through two programmable tri-state drivers 105 to two of conductors 22.

Figure 7A:
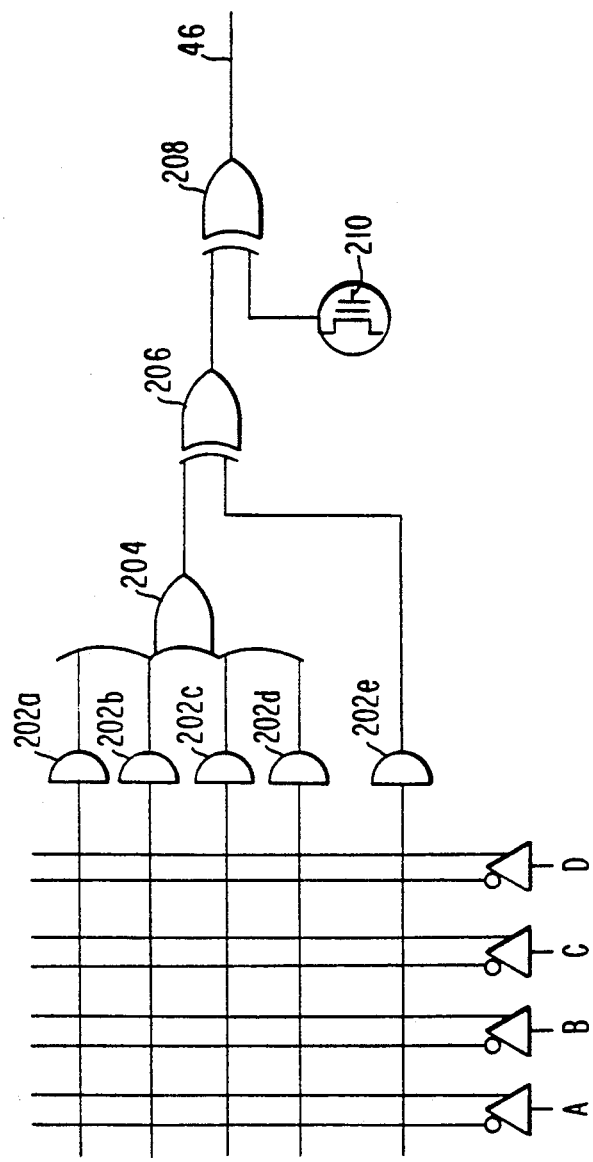
FIGS. 7a through 7c are schematic diagrams showing illustrative alternative embodiments of portions of the circuitry shown in FIG. 3.

As mentioned above, logic modules 12 can be implemented in other ways. For example, the portion of each logic module 12 which is described above as a look up table 40 can alternatively be implemented as sum-of-products logic of the type shown in FIG. 7a. The particular logic shown in FIG. 7a is of the well known "programmable AND, fixed OR" type. In this logic the true or complement of any of inputs A-D (which correspond to signals A-D in FIG. 3) is programmably connectable to each of AND gates 202a-e. Accordingly, each of these AND gates produces the logical "product" of the inputs connected to it. These products are sometimes referred to as "product terms" or "pterms". The outputs of AND gates 202a-d are all applied to OR gate 204. The output signal of OR gate 204 is therefore the logical "sum" of the applied pterms. The output of OR gate 204 is applied to EXCLUSIVE OR gate 206. The other input to gate 206 is pterm 202e. Accordingly, pterm 202e can be used (in conjunction with gate 206) to selectively invert or otherwise gate the sum-of-products output of OR gate 204. The output of gate 206 is applied to EXCLUSIVE OR gate 208. The other input to gate 208 is the output signal of programmable FCE 210 (similar to the other FCEs described above). Accordingly, FCE 210 can be used (in conjunction with gate 208) to selectively invert the output of gate 206. The output of gate 208 can be applied, inter alia, to the data input of the register 42 of the logic module.

Another example of a possible alternative construction of logic modules 12 is shown in commonly assigned, co-pending U.S. patent application Ser. No. 688,252, filed Apr. 22, 1991, which is hereby incorporated by reference herein. The macrocell structure 100 shown and described in that patent application can be readily employed as the logic module 12 in the programmable logic array structures of this invention.

Figure 7C:
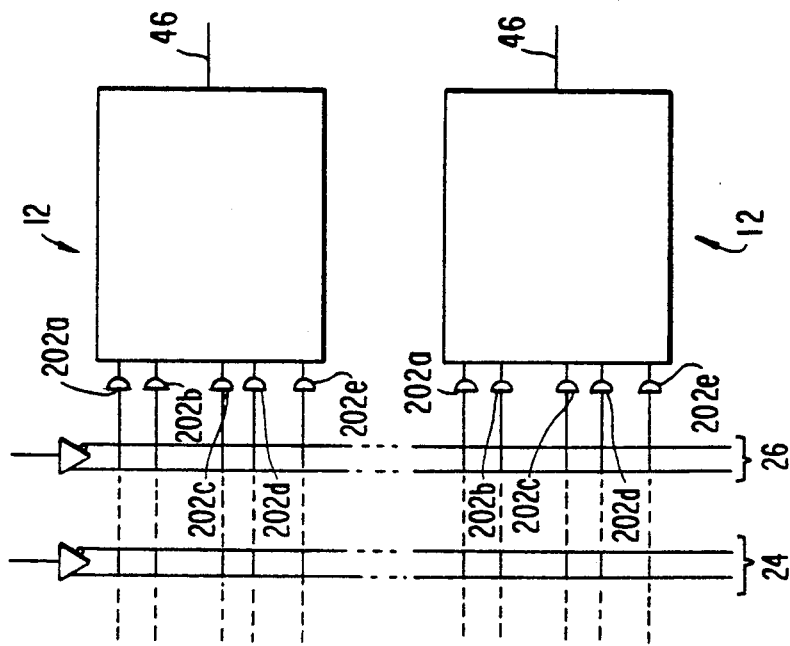
Figure 7B:
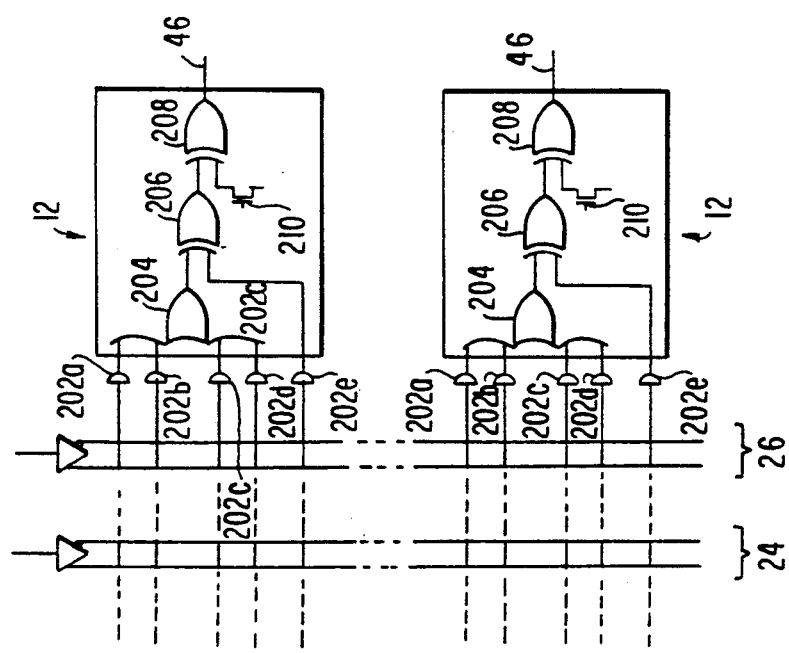

Still other examples of possible logic module construction are shown in FIGS. 7b and 7c. In FIG. 7b each conductor 24 and 26 (corresponding to conductors 24 and 26 in FIG. 2) is present in both the true and complement form. Pterms are formed in programmable connections between these conductors and the inputs to AND gates 202a-e. The remainder of each FIG. 7b logic module may then be similar to the corresponding portion of the circuitry shown in FIG. 7a.

In the further alternative shown in FIG. 7c, the circuitry outside the rectangular boxes may be identical to the corresponding portion of FIG. 7b. The circuitry represented by each rectangular box in FIG. 7c may be the macrocell structure 100 shown in above-mentioned U.S. patent application Ser. No. 688,252.

Figure 8:
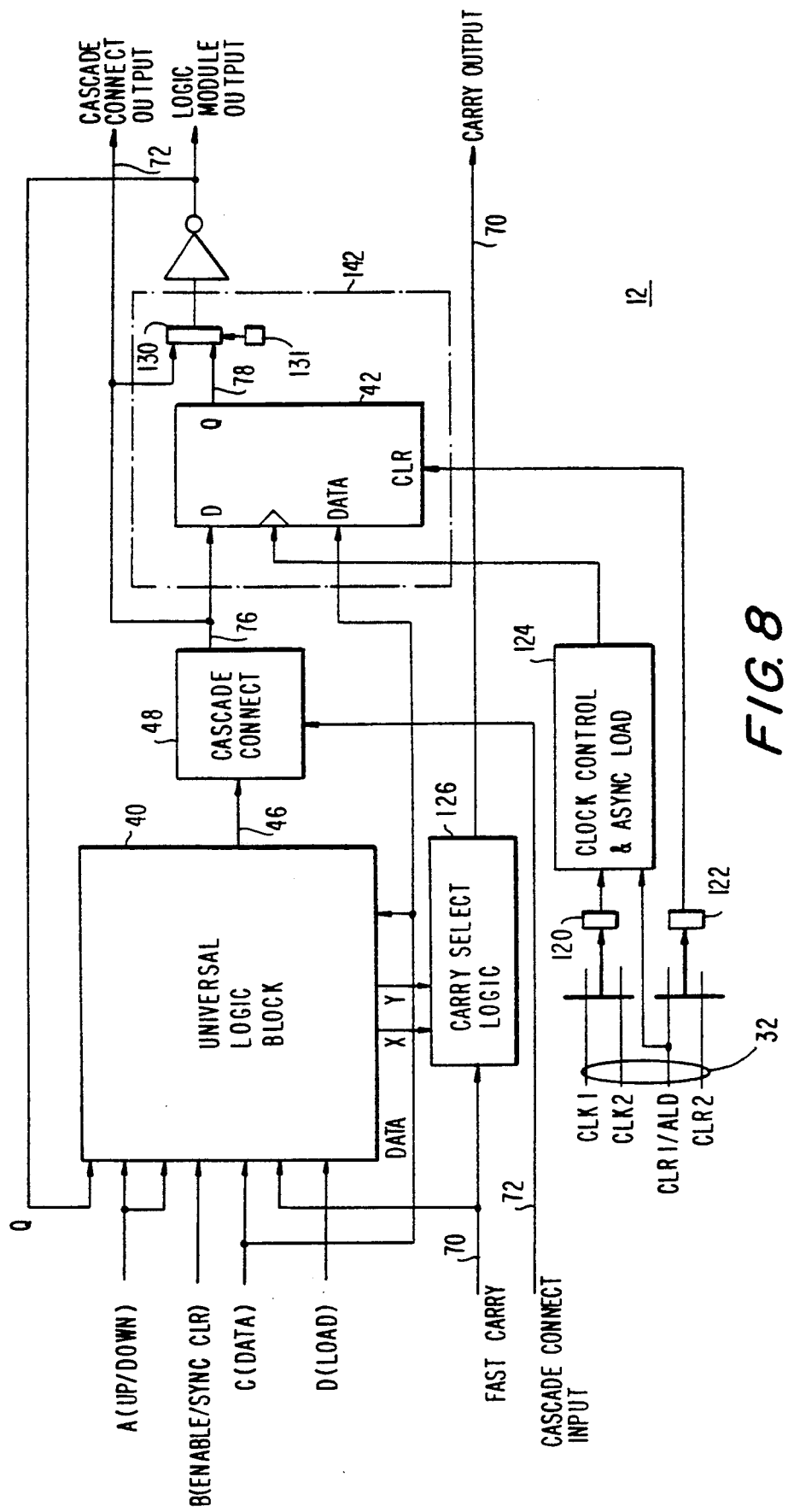
FIG. 8 is another more detailed schematic block diagram of an illustrative embodiment of a representative portion of FIG. 2.

FIG. 8 is another depiction of an illustrative logic module 12 in accordance with this invention. Certain features shown in FIG. 8—especially those related to the implementation of fast carry logic and the use of logic modules of this type in adders and counters—are shown in even more detail in above-mentioned U.S. patent application Ser. No. 07/880,752. For example, that application explains that input C is applied to flip-flop 42 as data (in addition to being applied to universal logic block 40) to facilitate loading data into the flip-flop when logic module 12 is to be used as one stage of a loadable counter. Cascade connect input 72 is applied as one input to logic element 48 (typically an AND gate as described above in connection with FIG. 3). The desired signals on clock and clear lines 32 are selected by programmable (i.e., FCE-controlled) PLCs 120 and 122. The output of PLC 122 is applied to the clear input terminal of flip-flop 42. The output of PLC 120 and one of signals 32 are applied to clock control and asynchronous load control logic 124 to produce a signal applied to the clock input terminal of flip-flop 42. This signal controls the clocking of flip-flop 42, as well as the asynchronous loading of that flip-flop (e.g., when loading the starting value into a loadable counter).

The main data output 46 of universal logic block 40 is the other input to logic element 48. The output of element 48 is the D input to flip-flop 42 (for registered output from logic module 12). The output of element 48 can also bypass flip-flop 42 via programmable (i.e., FCE-controlled) switch 130 (for unregistered output from the logic module). FCE 131 controls switch 130. Finally, the output of element 48 is also the cascade connect output 72 from this logic module to the next logic module 12 in the cascade connect chain.

Universal logic block 40 in FIG. 8 is equipped as shown in above-mentioned U.S. patent application Ser. No. 07/880/752 to provide as outputs X and Y the logical NOR and logical NAND of two inputs to block 40. As is also shown in said above-mentioned application, carry select logic 126 inverts X and Y, and then uses fast carry input 70 to select the appropriate one of the inverted signals as the fast carry output 70 to be applied to the next logic module 12 in the fast carry chain.

As mentioned above, FIG. 9 shows a typical tri-state driver 150 such as can be used for drivers 56 and 60 in FIG. 2. (Of course, any other suitable tri-state driver can be used instead if desired.) Data is applied to input terminal TRIIN, and a driver-enabling signal is applied to terminal RSELTRI (e.g., from a programmable RAM cell). If driver 150 is enabled by the latter signal, the input data is passed to output terminal TRIOUT. Driver 150 has three stages. The first stage includes P-channel transistors MP0 and MP1 and N-channel transistor MN0 connected in series between VCC (logical 1) and ground (logical 0). The TRIIN terminal is connected to the gates of MP0 and MN0. The inverted RSELTRI signal is applied to the gate of MP1. The second stage includes P-channel transistor MP2 and N-channel transistors MN1 and MN2 connected in series between VCC and ground. The RSELTRI signal is applied to the gates of MP2 and MN1. The signal between MP0 and MP1 is applied between MP2 and MN1, as well as to the gate of third stage P-channel transistor MP3. The signal between MP1 and MN0 is applied between MN1 and MN2, as well as to the gate of third stage N-channel transistor MN3. MP3 and MN3 are connected in series between VCC and ground. The node between MP3 and MN3 is TRIOUT.

Although the use of tri-state drivers is preferred for elements such as 56 and 60 in FIG. 2, in some embodiments of the invention it may be possible to employ simple buffers instead.

It will be understood that the foregoing is merely illustrative of the principles of this invention, and that various modifications can be made by those skilled in the art without departing from the scope and spirit of the invention. For example, the number of logic elements in each LAB can be altered if desired. Similarly, the number of LABs can be varied, as can the numbers of the various types of conductors and inter-conductor connections. As still another example of modifications with the scope of this invention, any of the techniques shown in FIGS. 5-9 of above-mentioned U.S. patent application Ser. No. 754,017 can be used to facilitate providing conductor interconnections of the type indicated, for example, at 31, 49, and 53 in FIG. 2 herein.

We claim:

1. A programmable logic array integrated circuit comprising:
   a plurality of programmable logic modules, each of which has a plurality of inputs and at least one output for producing as said output a programmable logical function of said inputs, said logic modules being disposed on said circuit in a two dimensional array;
   a first network of conductors for programmably connecting the output of substantially any of said logic modules to substantially any of said logic module inputs, said first network including a plurality of first conductors extending substantially only parallel to a first of the two dimensions of said array, a plurality of second conductors extending substantially only parallel to a second of the two dimensions of said array, and means for selectively connecting each of said first conductors to at least a respective one of said second conductors;
   third and fourth conductors for respectively conveying first and second clock signals adjacent to substantially every one of said logic modules, each of said third and fourth conductors having components which extend parallel to both said first and second dimensions of said array; and
   means associated with each of said logic modules for selecting the clock signal on one of said third and fourth conductors and for applying the selected clock signal to said logic module.

2. A programmable logic array integrated circuit comprising:
   a plurality of logic modules, each of which has a plurality of inputs and at least one output for producing as said output a programmable logic function of said inputs, said logic modules being grouped in a plurality of logic array blocks, said blocks being disposed on said circuit in a two dimensional array including intersecting rows and columns of said blocks;
   a plurality of first conductors associated with each of said blocks for selectively applying the outputs of the logic modules in the associated block to the inputs of the logic modules in that block;
   a plurality of second conductors extending substantially parallel to a first dimension of said array, said second conductors being grouped in a plurality of groups, each of which is adjacent to a respective one of said rows of blocks, each second conductor in each of said groups of second conductors extending continuously past substantially all of the blocks in the adjacent row;
   means for selectively applying the outputs of the logic modules in a row to the second conductors in the group adjacent to said row;
   means for selectively applying the signals on the second conductors in each group to the inputs of the logic modules in the row adjacent to said group;
   a plurality of third conductors extending substantially parallel to a second dimension of said array, said third conductors being grouped in a plurality of groups, each of which is adjacent to a respective one of said columns of blocks, each third conductor in each of said groups of third conductors extending continuously past substantially all of the blocks in the adjacent column;

means for selectively applying the outputs of the logic modules in each column to the third conductors in the group adjacent to said column; and means for selectively connecting said third conductors to said second conductors; wherein said means for selectively applying the signals on the second conductors in each group to the inputs of the logic modules in the row adjacent to said group comprises:

a plurality of fourth conductors associated with each of said blocks;

a first programmable logic connector connected between a plurality of the second conductors in the group adjacent to the row including said block and each of said fourth conductors;

programmable function control element means for controlling each first programmable logic connector to select at least one of the second conductors connected to that first programmable logic connector as a source for a signal applied to the fourth connector connected to that first programmable logic connector;

a second programmable logic connector connected between a plurality of the fourth conductors associated with each of said blocks and each input of the logic modules in said block; and programmable function control element means for controlling each second programmable logic connector to select at least one of the fourth conductors connected to that second programmable logic connector as a source for a signal applied to the logic module input connected to that second programmable logic connector.

3. The circuit defined in claim 2 wherein each second programmable logic connector is additionally connected between a plurality of the first conductors associated with the same block with which the fourth conductors connected to that second programmable logic connector are associated and each input of the logic modules in said block, and wherein said programmable function control element means for controlling each second programmable logic connector causes that second programmable logic connector to select at least one of the first and fourth conductors connected to that second programmable logic connector as a source for a signal applied to the logic module input connected to that second programmable logic connector.

4. A programmable logic array integrated circuit comprising:

a plurality of logic modules, each of which has a plurality of inputs and at least one output for producing as said output a programmable logical function of said inputs, said logic modules being grouped in a plurality of logic array blocks, said blocks being disposed on said circuit in a two dimensional array including intersecting rows and columns of said blocks;

a plurality of first conductors associated with each of said blocks for selectively applying the outputs of the logic modules in the associated block to the inputs of the logic modules in that block;

a plurality of second conductors extending substantially parallel to a first dimension of said array, said second conductors being grouped in a plurality of groups, each of which is adjacent to a respective one of said rows of blocks, each second conductor in each of said groups of second conductors extending continuously past substantially all of the blocks in the adjacent row;

means for selectively applying the outputs of the logic modules in a row to the second conductors in the group adjacent to said row;

means for selectively applying the signals on the second conductors in each group to the inputs of the logic modules in the row adjacent to said group;

a plurality of third conductors extending substantially parallel to a second dimension of said array, said third conductors being grouped in a plurality of groups, each of which is adjacent to a respective one of said columns of blocks, each third conductor in each of said groups of third conductors extending continuously past substantially all of the blocks in the adjacent column;

means for selectively applying the outputs of the logic modules in each column to the third conductors in the group adjacent to said column;

means for selectively connecting said third conductors to said second conductors;

at least one universal conductor extending adjacent to all of said blocks; and means for selectively applying a logic signal on said universal conductor to any of said logic modules.

5. The circuit defined in claim 4 wherein said means for selectively applying the logic signal on said universal conductor to any of said logic modules comprises:

at least one local conductor associated with each of said blocks;

means for selectively applying the logic signal on said universal conductor to the local conductor associated with any of said blocks; and means for applying the signal on each local conductor to any of the logic modules in the block associated with said local conductor.

6. A programmable logic array integrated circuit comprising:

a plurality of programmable logic modules, each of which has a plurality of inputs and at least one output for producing as said output a programmable logical function of said inputs;

a network of interconnection conductors for programmably conducting the output of substantially any of said logic modules to substantially any of said logic module inputs;

first and second clock signal conductors for respectively conveying first and second clock signals to substantially every one of said logic modules; and means associated with each of said logic modules for selecting the clock signal on one of said first and second clock signal conductors for application to said logic module.

7. A programmable logic array integrated circuit comprising:

a plurality of logic modules, each of which has a plurality of inputs and at least one output for producing as said output a programmable logical function of said inputs, said logic modules being grouped in a plurality of logic array blocks, said blocks being disposed on said circuit in a two dimensional array including intersecting rows and columns of said blocks;

a plurality of first conductors associated with each of said blocks for selectively applying the outputs of the logic modules in the associated block to the inputs of the logic modules in that block;

a plurality of second conductors extending substantially parallel to a first dimension of said array, said second conductors being grouped in a plurality of groups, each group being associated with a respective one of said rows of blocks, each second conductor in each of said groups of second conductors extending continuously past substantially all of the blocks in the associated row;

a plurality of third conductors extending substantially parallel to a second dimension of said array, said third conductors being grouped in a plurality of groups, each group being associated with a respective one of said columns of blocks, each third conductor in each of said groups of third conductors extending continuously past substantially all of the blocks in the associated column;

means for selectively applying the output of each logic module to at least one of the second or third conductors in the group of second or third conductors associated with the block which includes that logic module;

means for selectively connecting each of said second conductors to at least one of said third conductors;

a plurality of fourth conductors associated with each of said blocks;

means for selectively connecting to each of the fourth conductors associated with each of said blocks any one of a multiplicity of said second or third conductors in the group of second or third conductors associated with that block; and means for selectively connecting each of said fourth conductors associated with each of said blocks to the inputs of the logic modules in that block.

8. A programmable logic array integrated circuit comprising:

a plurality of logic modules, each of which has a plurality of inputs and at least one output for producing as said output a programmable logical function of said inputs, said logic modules being disposed on said circuit in a two dimensional array;

a plurality of first conductors extending substantially parallel to a first dimension of said array;

a plurality of second conductors extending substantially parallel to a second dimension of said array;

an input pin associated with each of said first conductors;

first tri-state driver means associated with each of said first conductors, each of said first tri-state driver means being programmable to selectively apply to the associated first conductor a signal applied to the input pin associated with that first conductor;

a programmable switch associated with each of said logic modules for selecting as an output signal either the output of the associated logic module or the signal on one of said second conductors; and second tri-state driver means associated with each of said programmable switches, each of said second tristate driver means being programmable to selectively apply the output signal of the associated programmable switch to one of said first conductors.

9. The circuit defined in claim 8 further comprising:
programmable memory means associated with each of said first and second tri-state driver means for controlling the associated tri-state driver means.

10. The circuit defined in claim 8 wherein each of said programmable switches is a multiplexer.

11. The circuit defined in claim 10 further comprising:
programmable memory means associated with each of said multiplexers for controlling the associated multiplexer.

* * * * *